US007635941B2

(12) United States Patent
Bank et al.

(10) Patent No.: US 7,635,941 B2
(45) Date of Patent: Dec. 22, 2009

(54) TRANSDUCER

(75) Inventors: Graham Bank, Cambridgeshire (GB); Neil Harris, Cambridgeshire (GB)

(73) Assignee: New Transducers Limited, Huntingdon, Cambridgeshire (GB)

( * ) Notice: Subject to any disclaimer, the term of this patent is extended or adjusted under 35 U.S.C. 154(b) by 18 days.

(21) Appl. No.: 10/514,913

(22) PCT Filed: Apr. 30, 2003

(86) PCT No.: PCT/GB03/01857

§ 371 (c)(1),
(2), (4) Date: Apr. 4, 2005

(87) PCT Pub. No.: WO03/098964

PCT Pub. Date: Nov. 27, 2003

(65) Prior Publication Data

US 2005/0168111 A1 Aug. 4, 2005

Related U.S. Application Data

(60) Provisional application No. 60/381,803, filed on May 21, 2002.

(30) Foreign Application Priority Data

May 20, 2002 (GB) ................................ 0211508.7

(51) Int. Cl.
*H01L 41/08* (2006.01)

(52) U.S. Cl. ........................ 310/328; 310/348; 310/352

(58) Field of Classification Search ................ 310/320, 310/321, 328–332, 348, 351–353, 339
See application file for complete search history.

(56) References Cited

U.S. PATENT DOCUMENTS 2,045,404 A * 6/1936 Nicholides .................. 381/151
2,270,167 A * 1/1942 Meissner et al. ............ 381/190
2,769,867 A * 11/1956 Crownover et al. ......... 381/163
3,186,237 A * 6/1965 Forrest .................... 73/514.34
3,394,275 A * 7/1968 Lippmann ................... 310/329

(Continued)

FOREIGN PATENT DOCUMENTS

DE 2737034 * 10/1978

(Continued)

*Primary Examiner*—Thomas M Dougherty
(74) *Attorney, Agent, or Firm*—Roylance Abrams, Berdo & Goodman, L.L.P.; Alan I. Cantor

(57) ABSTRACT

An electromechanical force transducer having an intended operative frequency range comprises a resonant element (10) having a periphery and having a frequency distribution of modes in the operative frequency range, characterized by support means (16) coupled to the periphery of the resonant element, the support means (16) having a substantially restraining nature in relation to bending wave vibration of the resonant element (10). The transducers may be mounted to an acoustic radiator (12) in a loudspeaker via coupling means (14) to excite the acoustic radiator to produce an acoustic output.

37 Claims, 4 Drawing Sheets

U.S. PATENT DOCUMENTS

| | | | | | |
|---|---|---|---|---|---|
| 3,653,253 | A | * | 4/1972 | Olin | 73/24.03 |
| 4,140,936 | A | * | 2/1979 | Bullock | 310/328 |
| 4,593,160 | A | * | 6/1986 | Nakamura | 381/163 |
| 4,705,059 | A | * | 11/1987 | Lecerf et al. | 137/82 |
| 4,814,753 | A | * | 3/1989 | Coppola | 340/689 |
| 5,251,188 | A | * | 10/1993 | Parsons et al. | 367/140 |
| 5,552,655 | A | * | 9/1996 | Stokes et al. | 310/330 |
| 5,677,487 | A | * | 10/1997 | Hansen | 73/514.34 |
| 5,705,880 | A | * | 1/1998 | Shimura et al. | 310/366 |
| 5,804,906 | A | * | 9/1998 | Tsutsumi | 310/322 |
| 6,078,674 | A | * | 6/2000 | Cattafesta et al. | 381/71.7 |
| 6,259,188 | B1 | * | 7/2001 | Woodard et al. | 310/330 |
| 6,285,063 | B1 | * | 9/2001 | Splett et al. | 257/415 |
| 6,674,219 | B1 | * | 1/2004 | Szilagyi et al. | 310/328 |
| 7,034,440 | B2 | * | 4/2006 | Kim et al. | 310/339 |
| 7,116,036 | B2 | * | 10/2006 | Balasubramaniam et al. | 310/322 |
| 7,180,225 | B2 | * | 2/2007 | Sashida et al. | 310/330 |
| 7,258,533 | B2 | * | 8/2007 | Tanner et al. | 417/413.2 |
| 7,482,734 | B2 | * | 1/2009 | Takeuchi et al. | 310/331 |
| 2001/0026625 | A1 | | 10/2001 | Azima et al. | |
| 2001/0033669 | A1 | * | 10/2001 | Bank et al. | 381/152 |
| 2001/0055403 | A1 | | 12/2001 | Bachmann et al. | |
| 2003/0059069 | A1 | * | 3/2003 | Bank et al. | 381/152 |
| 2004/0056564 | A1 | * | 3/2004 | Iino et al. | 310/323.02 |
| 2004/0056566 | A1 | * | 3/2004 | Rubach | 310/348 |
| 2004/0085001 | A1 | * | 5/2004 | Takeshima | 310/331 |
| 2004/0195935 | A1 | * | 10/2004 | Jansson et al. | 310/317 |
| 2006/0146096 | A1 | * | 7/2006 | Wright et al. | 347/68 |
| 2007/0086616 | A1 | * | 4/2007 | Bank et al. | 381/338 |

FOREIGN PATENT DOCUMENTS

| | | | | |
|---|---|---|---|---|
| DE | 19644161 | A1 | * | 5/1997 |
| EP | 0065883 | A3 | * | 12/1982 |
| JP | 54-38791 | | * | 3/1979 |
| JP | 57-4698 | | * | 1/1982 |
| JP | 63-016800 | | * | 1/1988 |
| JP | 10-144976 | | * | 5/1998 |
| JP | 11-233843 | | * | 8/1999 |
| JP | 2000-134697 | | * | 5/2000 |
| WO | WO-97/09861 | A1 | * | 3/1997 |
| WO | WO 01/54450 | A2 | | 7/2001 |

* cited by examiner

TRANSDUCER

This application claims the benefit of U.S. provisional application No. 60/381,803, filed May 21, 2002.

TECHNICAL FIELD

The invention relates to transducers, actuators or exciters, in particular but not exclusively transducers for use in acoustic devices, e.g. loudspeakers and microphones.

BACKGROUND ART

It is known from WO 01/54450 in the name New Transducers Limited to provide an electromechanical force transducer comprising a resonant element having a frequency distribution of modes in the operative frequency range of the transducer. The parameters of the resonant element may be selected to enhance the distribution of modes in the element in the operative frequency range. The transducer may thus be considered to be an intendedly modal transducer.

The transducer may be coupled to a site to which force is to be applied by coupling means which may be attached to the resonant element at a position which is beneficial for coupling modal activity of the resonant element to the site. Thus for example as shown in FIG. 1, the transducer 132 may comprise a resonant element in the form of a beam which is coupled to a panel 134 by two coupling means 136 in the form of stubs. One stub is located towards an end 138 of the beam and the other towards the centre of the beam. The opposite end 140 is not supported and is thus free to move.

DISCLOSURE OF INVENTION

According to the present invention, there is provided an electromechanical force transducer having an intended operative frequency range and comprising a resonant element having a frequency distribution of modes in the operative frequency range, characterised by support means coupled to the periphery of the resonant element, the support means having a substantially restraining nature in relation to bending wave vibration of the resonant element.

The transducer may be for applying a force to a load, e.g. to excite an acoustic radiator to produce an acoustic output or to drive non-acoustic loads, e.g. inkjet printer heads.

Restraining the resonant element alters its boundary conditions which affects the performance of the transducer. Accordingly, the nature of the support means may be selected to achieve a desired performance of the transducer and may for example extend its bandwidth. The support means may partially or substantially simply support or clamp the resonant element. The support means may extend along at least part of and/or be coupled to at least two discrete portions of the periphery.

Simply supporting means restraining the resonant element to allow rotational but not translational movement of the resonant element about the support. The support thus acts as a hinge and has zero compliance. Clamping means constraining the resonant element to prevent both translational and rotational movement about the clamp. The velocity of the resonant element at the support or clamp is zero. In practice, it is difficult if not impossible to achieve zero velocity and thus the support means may approximate to simply supporting or clamping.

The resonant element may be rectangular and the support means may comprise portions engaging opposite edges of the resonant element. The resonant element may be generally disc-shaped and the support means may extend along part or whole of the perimeter. Alternatively, the support means may be located at least three positions on the perimeter and the positions may be equally spaced around the perimeter. The resonant element may be triangular and the support means may be located at each vertex of the triangle. The resonant element may be trapezoidal or hyperelliptical. The resonant element may be plate-like and may be planar or curved out of planar.

The support means may be vestigial, e.g. a layer of suitable adhesive. The transducer may further comprise coupling means on the resonant element for mounting the transducer to a site to which force is to be applied. The support means may be adapted to mount the transducer to the site or to a separate support, i.e. to ground the transducer. In this way, the support means may increase the ruggedness of the transducer and improve its resistant to shock and drop impacts.

The support means may be integral with the resonant element. The resonant element may be a bi-morph with a central vane and the central vane may be adapted to form the support means. Alternatively, the support means may in the form of discrete supports.

The parameters, e.g. aspect ratio, geometry and isotropy or anisotropy of bending stiffness or thickness, of the resonant element may be selected to enhance the distribution of modes in the resonant element in the operative frequency range. Analysis, e.g. computer simulation using FEA or modelling, may be used to select the parameters.

The distribution may be enhanced by ensuring a first mode of the active element is near to the lowest operating frequency of interest. The distribution may also be enhanced by ensuring a satisfactory, e.g. high, density of modes in the operative frequency range. The density of modes is preferably sufficient for the active element to provide an effective mean average force which is substantially constant with frequency. The distribution of modes may also be enhanced by distributing the resonant bending wave modes substantially evenly in frequency.

The resonant element may be modal along two substantially normal axes, each axis having an associated fundamental frequency. The ratio of the two fundamental frequencies may be adjusted for best modal distribution, e.g. 9:7 (~1.286:1).

The resonant element may be active and may be a piezoelectric, a magnetostrictive or an electret device. The piezoelectric active element may be pre-stressed, for example as described in U.S. Pat. No. 5,632,841 or may be electrically prestressed or biased. The active element may be a bi-morph, a bi-morph with a central vane or substrate or a uni-morph. The active element may be fixed to a backing plate or shim which may be a thin metal sheet and may have a similar stiffness to that of the active element.

The resonant element may be passive and may be coupled by connecting means to an active transducer element which may be a moving coil, a moving magnet, a piezoelectric, a magnetostrictive or an electret device. The connecting means may be attached to the resonant element at a position which is beneficial for enhancing modal activity in the resonant element. The passive resonant element may act as a short term resonant store and may have low natural resonant frequencies so that its modal behaviour is satisfactorily dense in the range where it performs its loading and matching action for the active element.

The transducer may comprise a plurality of resonant elements each having a distribution of modes, the modes of the resonant elements being arranged to interleave in the operative frequency range and thus enhance the distribution of modes in the transducer as a whole device. The resonant elements may be coupled together by connecting means and may be arranged in a stack with axially aligned coupling points. The resonant devices may be passive or active or combinations of passive and active devices to form a hybrid transducer.

The transducer may comprise a flat piezoelectric disc; a combination of at least two or preferably at least three flat piezoelectric discs; two coincident piezoelectric beams; a combination of multiple coincident piezoelectric beams; a curved piezoelectric plate; a combination of multiple curved piezoelectric plates or two coincident curved piezoelectric beams.

Each resonant element may have a different fundamental resonance. The interleaving of the distribution of the modes in each resonant element may be enhanced by optimising the frequency ratio of the resonant elements, i.e. the ratio of the frequencies of each fundamental resonance of each resonant element. For a transducer comprising two beams, the two beams may have a frequency ratio of 1.27:1 and for a transducer comprising three beams, the frequency ratio may be 1.315:1.147:1. For a transducer comprising two discs, the frequency ratio may be 1.1:1 to optimise high order modal density or may be 3.2:1 to optimise low order modal density. For a transducer comprising three discs, the frequency ratio may be 3.03:1.63:1 or may be 8.19:3.20:1.

The support means may be coupled to the periphery of each resonant element. Alternatively, at least one resonant element may be unrestrained, i.e. not coupled to the support means and free to move.

According to a second aspect of the invention, there is provided a loudspeaker comprising an acoustic radiator and a modal transducer as defined above, the transducer being coupled via coupling means to the acoustic radiator to excite the acoustic radiator to produce an acoustic output. The coupling means may be vestigial, e.g. a controlled layer of adhesive. The resonant member may be acoustically substantially inactive.

In both the first and second embodiments, the coupling means may form a line of attachment or a point or small local area of attachment where the area of attachment is small in relation to the size of the resonant element. The coupling means may comprise a combination of points and/or lines of attachment. Alternatively only a single coupling point may be provided, whereby the output of the or each resonant elements is summed through the single coupling means rather than the acoustic radiator. The coupling means may be attached to the resonant element at a position which is beneficial for coupling modal activity of the resonant element to the site or acoustic radiator.

The coupling means may be chosen to be located at an anti-node on the resonant element and may be chosen to deliver a constant average force with frequency. The coupling means may be positioned at the centre of or away from the centre of the resonant element.

The mechanical impedance of the transducer may be matched to the mechanical impedance of the load, i.e. to the acoustic radiator. The boundary conditions of the transducer may be selected to provide the required mechanical impedance of the transducer. The transducer may be mounted to a second load, e.g. a panel, which ensures impedance matching between the primary load and the transducer. The second load may be perforated to prevent acoustic radiation therefrom.

The loudspeaker may be intendedly pistonic over at least part of its operating frequency range or may be a bending wave loudspeaker. The parameters of the acoustic radiator may be selected to enhance the distribution of modes in the resonant element in the operative frequency range. The loudspeaker may be a resonant bending wave mode loudspeaker having an acoustic radiator and a transducer fixed to the acoustic radiator for exciting resonant bending wave modes. Such a loudspeaker is described in International Patent Application WO97/09842 and other patent applications and publications, and may be referred to as a distributed mode loudspeaker.

The acoustic radiator may be in the form of a panel. The panel may be flat and may be lightweight. The material of the acoustic radiator may be anisotropic or isotropic. The properties of the acoustic radiator may be chosen to distribute the resonant bending wave modes substantially evenly in frequency, i.e. to smooth peaks in the frequency response caused by "bunching" or clustering of the modes. In particular, the properties of the acoustic radiator may be chosen to distribute the lower frequency resonant bending wave modes substantially evenly in frequency.

The transducer location may be chosen to couple substantially evenly to the resonant bending wave modes in the acoustic radiator, in particular to lower frequency resonant bending wave modes. In other words, the transducer may be mounted at a location where the number of vibrationally active resonance anti-nodes in the acoustic radiator is relatively high and conversely the number of resonance nodes is relatively low.

According to a third aspect of the invention, there is a provided electronic apparatus having a body and comprising a loudspeaker as described above mounted in the body. The support means may be mounted to the body. The electronic apparatus may be in the form of a mobile phone. The support means may extend from the casing of the mobile phone. The support means may be moulded as part of the casing or fixed to the or each resonant element prior to assembly into the casing.

The operative frequency range may be over a relatively broad frequency range and may be in the audio range and/or ultrasonic range. There may also be applications for sonar and sound ranging and imaging where a wider bandwidth and/or higher possible power will be useful by virtue of distributed mode transducer operation. Thus, operation over a range greater than the range defined by a single dominant, natural resonance of the transducer may be achieved. The lowest frequency in the operative frequency range is preferably above a predetermined lower limit which is about the fundamental resonance of the transducer.

BRIEF DESCRIPTION OF DRAWINGS

The invention is diagrammatically illustrated, by way of example, in the accompanying drawings in which:

FIG. 2 shows a transducer comprising a resonant element in the form of a 36 mm piezoelectric beam 10 which is connected to an acoustic radiator 12 by coupling means 14 in the form of a stub which is mounted centrally along the beam 10. Each end of the beam 10 is attached to support means 16 whereby the ends of the beam 10 are simply supported. Thus, in contrast to the prior art transducer of FIG. 1, neither end of the beam 10 is free to move. Simply supporting the beam reduces its inertia and thus increases its resistance to shock and drop impacts.

Figure 1:
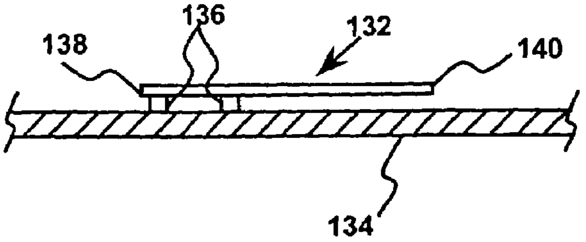
Fig. 1 (Prior art)
FIG. 1 is a cross-section of a loudspeaker comprising a transducer according to the prior art.
Figure 2:
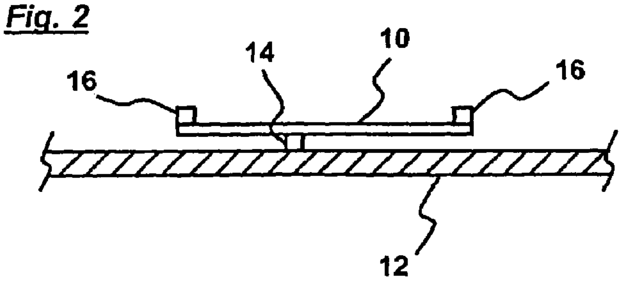
FIG. 2 is a cross-section of a transducer according to a first aspect of the invention.
Figure 3:
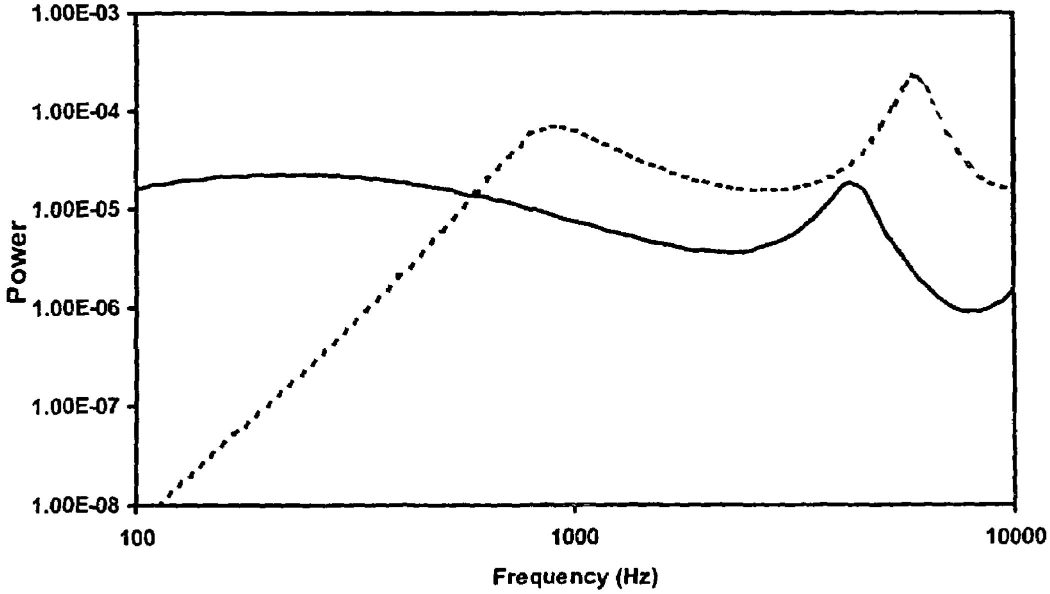
FIG. 3 is a graph of power versus frequency comparing the transducer of FIG. 2 with a known prior art transducer similar to that of FIG. 1.

The dotted and solid lines of FIG. 3 show the power output of the transducer of FIG. 2 with and without the connectors, respectively. Simply supporting the ends of the beam may be expected to stiffen the beam and hence raise its fundamental frequency. However, somewhat counter-intuitively, simply supporting greatly improves the low frequency (i.e. below 500 Hz) performance of the transducer. However, there is a general reduction in the power delivered across the mid and high frequency range, i.e. above 750 Hz.

Figure 4:
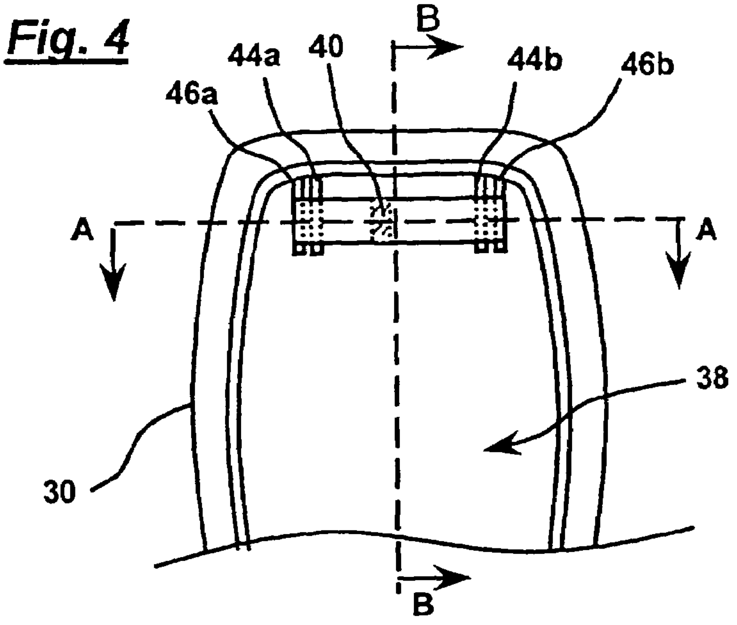
FIG. 4 is a front elevation of a section of a mobile phone according to another aspect of the invention.
Figure 5:
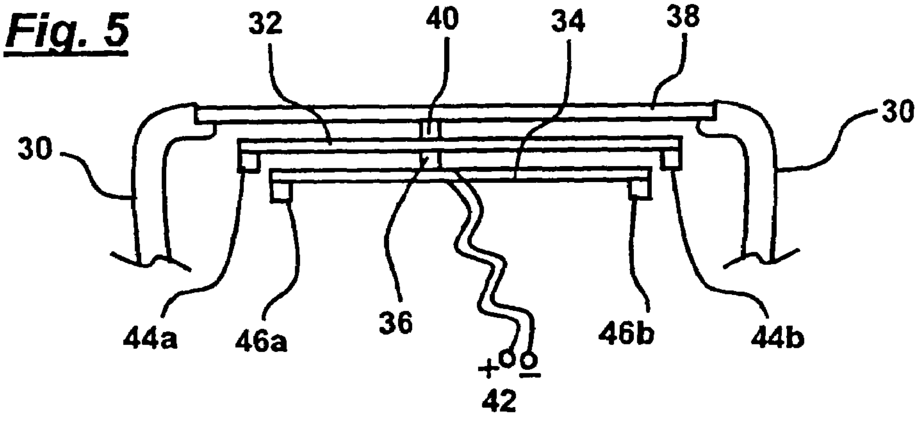
FIGS. 5 and 6 are cross-sections along lines AA and BB of FIG. 4.
Figure 6:
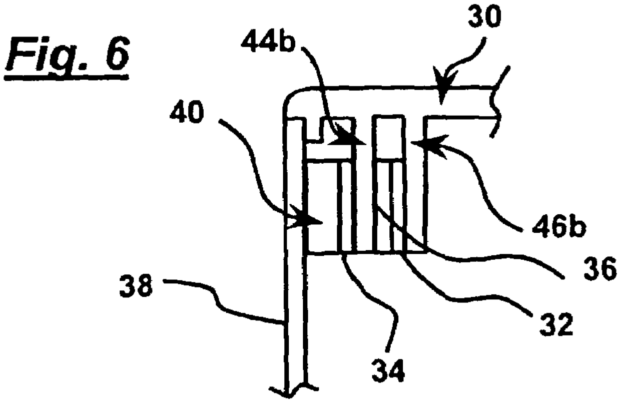

FIGS. 4 to 6 shows a transducer according to the present invention mounted in a mobile phone. The transducer comprises first and second piezoelectric beams 32,34 which are coupled together by connecting means 36 in the form of a stub. The first beam 32 is longer than the second beam 34. The casing 30 of the mobile phone comprises an acoustic radiator 38 which also acts as the display screen. The transducer is coupled to the acoustic radiator 38 by coupling means 40 in the form of a stub and excites the acoustic radiator 38 to produce an acoustic output in response to signals received by electrical connections 42. The electrical connections 42 connect to each beam via the stub. The coupling means 40 and the connecting means 36 are axially aligned and mounted centrally on respective beams.

The casing 30 comprises support means in the form of four elongate finger-like supports 44*a*,44*b*, 46*a*,46*b* which extend from the casing 30 beneath part of the acoustic radiator 38. A first pair of supports 44*a*, 44*b* supports each end of the first beam 32 and a second pair of supports 46*a*, 46*b* supports each end of the second beam 34. The ends of each support are aligned with the ends of the beams. The beams are fixed, e.g. by adhesive, to the respective supports, thus providing a boundary condition which approximates a simple support for the ends of the beams.

Figure 7:
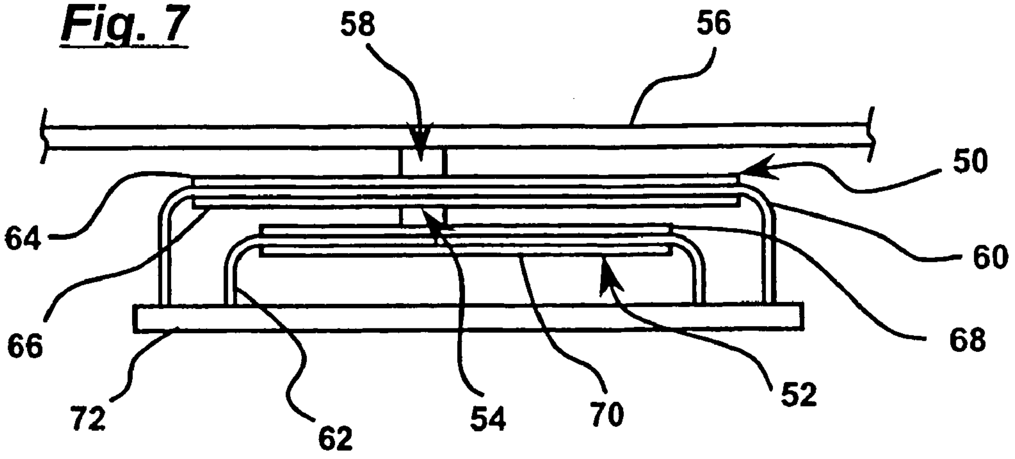
FIGS. 7 to 9 are cross-sections of alternative transducers.
Figure 8:
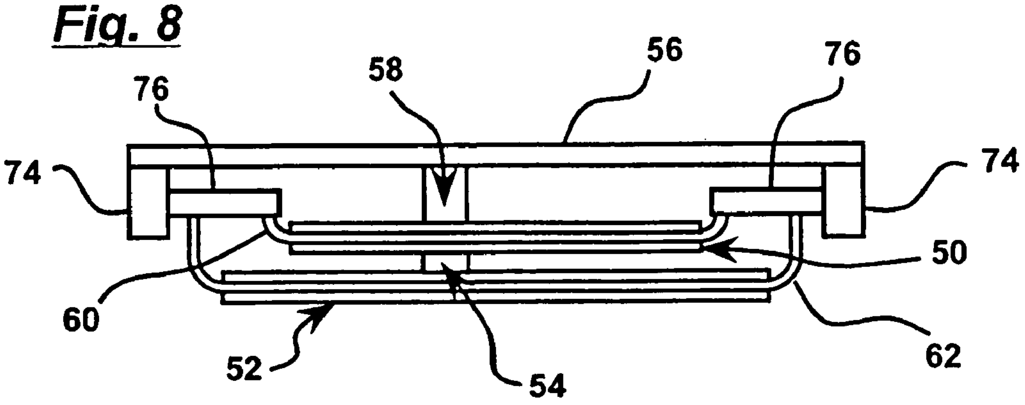
Figure 9:
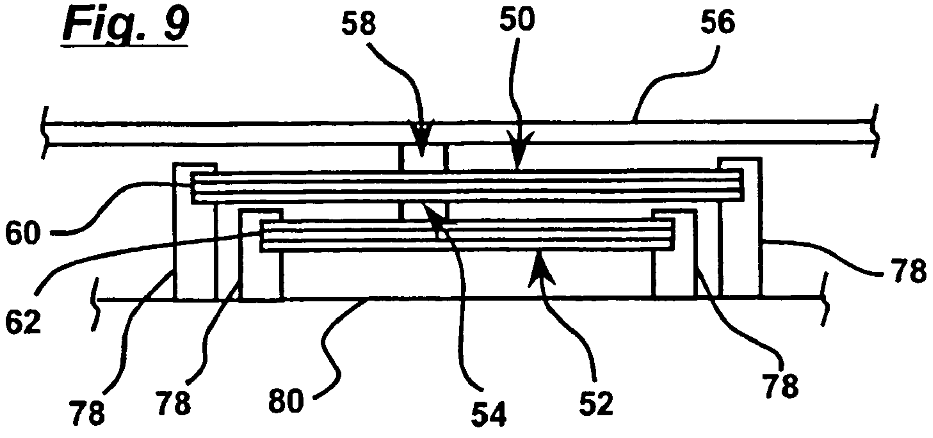

Alternative arrangements for the end terminations of the beams are shown in FIGS. 7 to 9. Elements in common to each arrangement carry the same reference number. The transducers may be used in the mobile phone of FIG. 4 or in other applications.

In FIGS. 7 to 9, the transducer comprises first and second beams 50,52 coupled by a centrally mounted stub 54. The first beam 50 is attached to an acoustic radiator 56 by a stub 58. Each beam comprises a central vane 60,62 sandwiched between upper and lower piezoelectric elements 64,66 68,70 which have equal length. The acoustic radiator may be in the form of a panel.

In FIGS. 7 and 8, the central vane 60,62 of each beam 50,52 is longer than both upper and lower elements of each beam and provides the support means. In FIG. 7, the central vanes 60,62 curve away from the acoustic radiator 56 and are attached to a support or carrier 72. This arrangement is particularly suitable for an acoustic radiator which has an area far greater than that of the transducer. Both arrangements approximate to substantially simply supporting the resonant elements.

In FIG. 8, the acoustic radiator 56 is mounted to a support 74 which extends around its perimeter. The central vanes 60,62 curve towards the acoustic radiator 56 and are attached to connectors 76 which extend inwardly from the support 74. In contrast to FIG. 7 the second beam 52 is longer than the first beam 50. This arrangement is particularly suitable for an acoustic radiator of similar size to the transducer and provides the same boundary conditions for both transducer and acoustic radiator. In this way, assembly is simplified since the transducer and radiator may be combined in a sub-assembly avoiding the need to attach the transducer to both a ground plane, e.g. casing, and to the acoustic radiator.

In FIG. 9, the central vanes 60,62 are co-extensive with the upper and lower elements of each beam. Both ends of each beam 50,52 are held in an individual support 78 which connect the beams to a frame 80. The beams 50,52 are held in shallow slots in the supports 78 so that the supports extend no more than 5% along the length of the beam. In this way, a boundary condition which is between simply supporting and clamping, i.e. partially clamping, is achieved. This arrangement is particularly suitable for larger acoustic radiators. The supports 78 may carry electrical connections to provide the signals to drive the transducer thereby removing the need for flexible wires. Pushing the supports onto to the beams may provide the necessary electrical contact.

Figure 10:
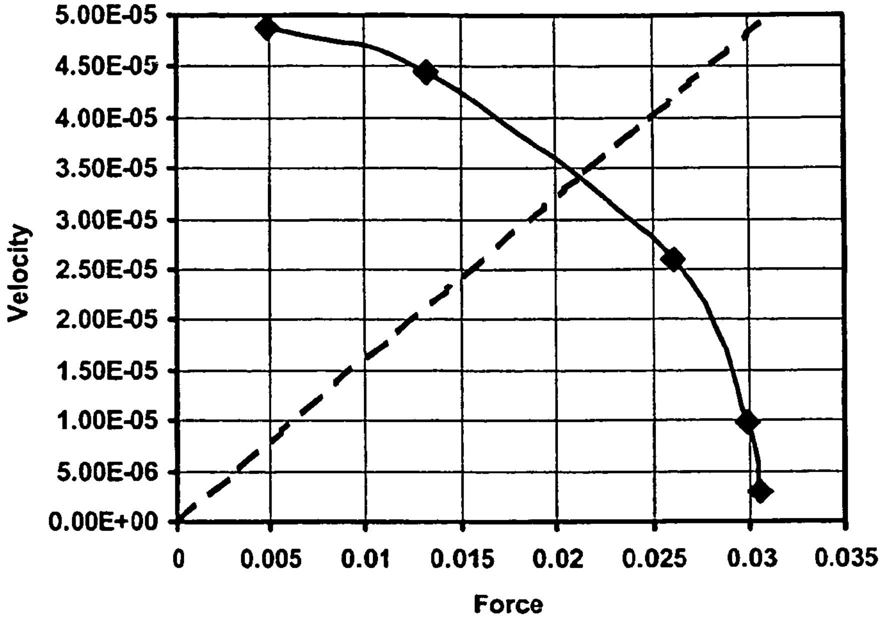
FIG. 10 is a graph showing velocity against force against frequency for a transducer similar to those of FIGS. 7 to 9.

FIG. 10 shows the velocity against force at 1 kHZ for a simply supported double-beam transducer. The maximum value of the velocity is calculated with no load and the maximum value of the force is calculated with an immovable load. The diagonal line shows the optimum load, i.e. the load at which maximum power transfer is obtained. As shown, this occurs when the force and velocity are at approximately 70% of their maximum values.

By matching the mechanical impedance of the load to the transducer, a relatively smooth variation of power, force and velocity with frequency which extends down to the 300 Hz region and below may be achieved. In contrast, if the load impedance is not matched, for example is too high or too low, there may be a 10-fold drop in power transfer. Lowering the load impedance may also introduce an extra low frequency mode, say at about 500 Hz. Simply supporting the ends increases the mechanical impedance of the transducer. For a double-beam transducer, the increase in mechanical impedance may be counteracted by removing one of the beams so that the transducer remains matched to the load impedance. In other words, a simply supported single beam transducer may have approximately the same impedance as a free double-beam transducer.

Figure 11:
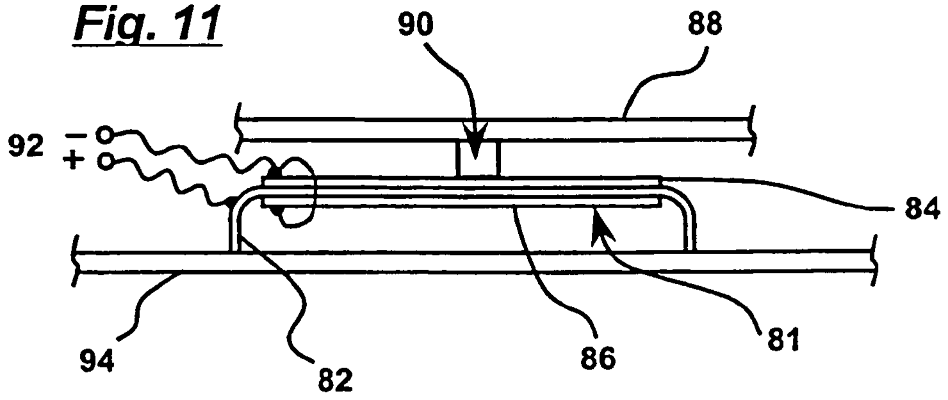
FIG. 11 is a cross-section of a transducer according to another aspect of the invention.

Another arrangement for achieving matching of the load impedance with that of the transducer is shown in FIG. 11. The transducer is similar to that used in FIG. 7 and comprises a single beam 81 having a central vane 82 sandwiched between upper and lower piezoelectric layers 84,86. The upper piezoelectric layer 84 is attached to a primary load, namely an acoustic radiator 88 by a central stub 90 and both layers 84,86 are driven by electrical connections 92.

The central vane 82 is longer than both piezoelectric layers and its ends are curved to attach to a second load, namely a panel 94. Together the curved ends and the panel 94 form the boundary conditions for the beam. The panel is used as the admittance for the beam-ends and is selected so that the impedance of the transducer matches that of the acoustic radiator 88. The panel 94 may be perforated to effectively prevent it from radiating any sound whilst preserving its mechanical impedance.

Figure 12:
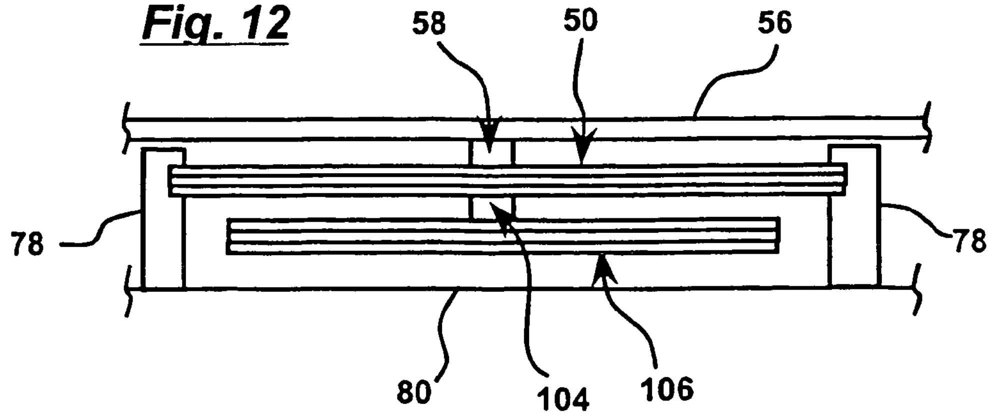
FIG. 12 is a cross-section of a transducer according to another aspect of the invention.

Any loss in power which occurs when restraining the ends of the beam may be overcome by combining the transducer with a transducer having an unrestrained resonant element. For example, FIG. 12 shows a first transducer having a beam 50, the ends of which are restrained in supports 78 and a second transducer comprising a beam 106 mounted to the first transducer 50 by a connecting stub 104. The ends of the second transducer 106 are not restrained. The power from both transducers is summed through stub 58 to drive the acoustic radiator 56. In this way, the acoustic output of the combination benefits from the low frequency extension of the restrained transducer and the higher output of the unrestrained transducer over mid-high frequencies.

The invention claimed is:

1. An electromechanical force transducer having an intended operative frequency range and comprising:

an active resonant element having a periphery and having a frequency distribution of modes in the operative frequency range with the parameters of the resonant element selected to enhance the distribution of modes in the resonant element, a simple support coupled to the periphery of the resonant element, the support having a substantially restraining nature in relation to bending wave vibration of the resonant element so as to extend the operative frequency range of the transducer, and a coupler on the resonant element, located away from the periphery of the resonant element, for mounting the transducer to a site to which force is to be applied.

2. A transducer according to claim 1, wherein the support is coupled to at least two discrete portions of the periphery of the resonant element.

3. A transducer according to claim 2, wherein the discrete portions are located about opposed positions on the periphery of the resonant element.

4. A transducer according to any preceding claim, wherein the support extends along at least part of the periphery of the resonant element.

5. A transducer according to claim 4, wherein the resonant element is planar.

6. A transducer according to claim 5, wherein the support is adapted to ground the transducer.

7. A transducer according to claim 6, wherein the support is integral with the resonant element.

8. A transducer according to claim 7, wherein the resonant element is a piezo-electric device.

9. A transducer according to claim 8, wherein the resonant element is a bi-morph piezo-electric device with a central vane which is adapted to form the support.

10. A transducer according to claim 9, wherein the resonant element is modal along two substantially normal axes, each axis having an associated fundamental frequency.

11. A transducer according to claim 1, comprising a plurality of resonant elements each having a distribution of modes, the modes of the resonant elements being arranged to interleave in the operative frequency range to enhance the distribution of modes in the transducer as a whole.

12. A transducer according to claim 11, wherein the resonant elements are coupled together by connectors and are arranged in a stack with axially aligned coupling points.

13. A transducer according to claim 11 or claim 12, wherein the support is coupled to the periphery of each resonant element.

14. A transducer according to claim 11 or claim 12, wherein at least one resonant element is unrestrained.

15. A loudspeaker comprising an acoustic radiator and a transducer as claimed in claim 11, the transducer being coupled via the coupler to the acoustic radiator to excite the acoustic radiator to produce an acoustic output.

16. A loudspeaker according to claim 15, wherein the resonant element is acoustically substantially inactive.

17. A loudspeaker according to claim 15 or claim 16, wherein the mechanical impedance of the transducer is matched to the mechanical impedance of the acoustic radiator.

18. A loudspeaker according to claim 17, wherein the transducer is mounted to a second load which ensures impedance matching between the acoustic radiator and the transducer.

19. Electronic apparatus having a body and comprising a loudspeaker according to claim 15 mounted in the body.

20. Electronic apparatus according to claim 19, wherein the support is mounted to the body.

21. Electronic apparatus according to claim 19 or claim 20, in the form of a portable cellular telephone.

22. A transducer according to claim 1, wherein the resonant element is planar.

23. A transducer according to claim 1, wherein the support is adapted to ground the transducer.

24. A transducer according to claim 1, wherein the support is integral with the resonant element.

25. A transducer according to claim 1, wherein the resonant element is a piezo-electric device.

26. A transducer according to claim 25, wherein the resonant element is a bi-morph piezo-electric device with a central vane which is adapted to form the support.

27. A transducer according to claim 1, wherein the resonant element is modal along two substantially normal axes, each axis having an associated fundamental frequency.

28. A loudspeaker comprising an acoustic radiator and a transducer as claimed in claim 1, the transducer being coupled via the coupler to the acoustic radiator to excite the acoustic radiator to produce an acoustic output.

29. A loudspeaker according to claim 28, wherein the resonant element is acoustically substantially inactive.

30. A loudspeaker according to claim 28 or claim 29, wherein the mechanical impedance of the transducer is matched to the mechanical impedance of the acoustic radiator.

31. A loudspeaker according to claim 30, wherein the transducer is mounted to a second load which ensures impedance matching between the acoustic radiator and the transducer.

32. Electronic apparatus having a body and comprising a loudspeaker according to claim 28 mounted in the body.

33. Electronic apparatus according to claim 32, wherein the support is mounted to the body.

34. Electronic apparatus according to claim 32 or claim 33, in the form of a portable cellular telephone.

35. A loudspeaker according to claim 15, wherein the coupler is located away from the centre of the resonant element.

36. A loudspeaker according to claim 28, wherein the coupler is located away from the centre of the resonant element.

37. A transducer according to claim 2, wherein the resonant element is in the form of a beam, the discrete portions are located at the ends of the beam, and the coupler is located between the ends of the beam.

* * * * *